United States Patent [19]

Hearn et al.

[11] Patent Number: 5,740,411

[45] Date of Patent: Apr. 14, 1998

[54] CONTROLLABLY SWITCHED PHASE LOCKED LOOP CIRCUITS, SYSTEMS, AND METHODS

[75] Inventors: Alan S. Hearn, Richardson; Larry R. Hite, Dallas, both of Tex.

[73] Assignee: Texas Instruments Incorporated, Dallas, Tex.

[21] Appl. No.: 756,669

[22] Filed: Nov. 26, 1996

[51] Int. Cl.$^6$ .................................................. H03L 7/06
[52] U.S. Cl. .................. 345/558; 331/25; 331/1 A; 375/376
[58] Field of Search ...................... 395/555, 556, 395/558; 331/1 A, 25, 57; 327/56–59; 375/376

[56] References Cited

U.S. PATENT DOCUMENTS

| 4,602,225 | 7/1986 | Miller et al. ............... 331/1 A X |
| 4,829,258 | 5/1989 | Volk et al. ................. 331/1 A X |
| 4,972,442 | 11/1990 | Steierman ................. 331/1 A X |
| 5,126,690 | 6/1992 | Bui et al. .................. 331/1 A |
| 5,128,632 | 7/1992 | Erhart et al. .............. 331/1 A |
| 5,506,531 | 4/1996 | Jang et al. ................. 331/1 A X |

*Primary Examiner*—Thomas M. Heckler
*Attorney, Agent, or Firm*—Robert D. Marshall, Jr.; James C. Kesterson; Richard L. Donaldson

[57] ABSTRACT

Circuits, systems, and methods, relating to a controllably switched phase locked loop. The system includes a phase locked loop circuit (16) having a clock signal input (16c), a clock signal lock input (16a), and a clock adjustment signal input (16b). The system further includes circuitry (12c) for coupling a clock signal to the clock signal input, circuitry (28) for coupling a first clock adjustment signal to the clock adjustment signal input, and circuitry (24) for comparing the first clock adjustment signal to a second clock adjustment signal. Lastly, the system includes circuitry responsive to the comparing circuitry. This responsive circuitry includes firstly, circuitry (26) for coupling a signal to the clock signal lock input such that the phase locked loop circuit indicates an unlocked state, and secondly circuitry (22, 28) for coupling the second clock adjustment signal to the clock adjustment signal input after the phase locked loop circuit indicates an unlocked state.

18 Claims, 2 Drawing Sheets

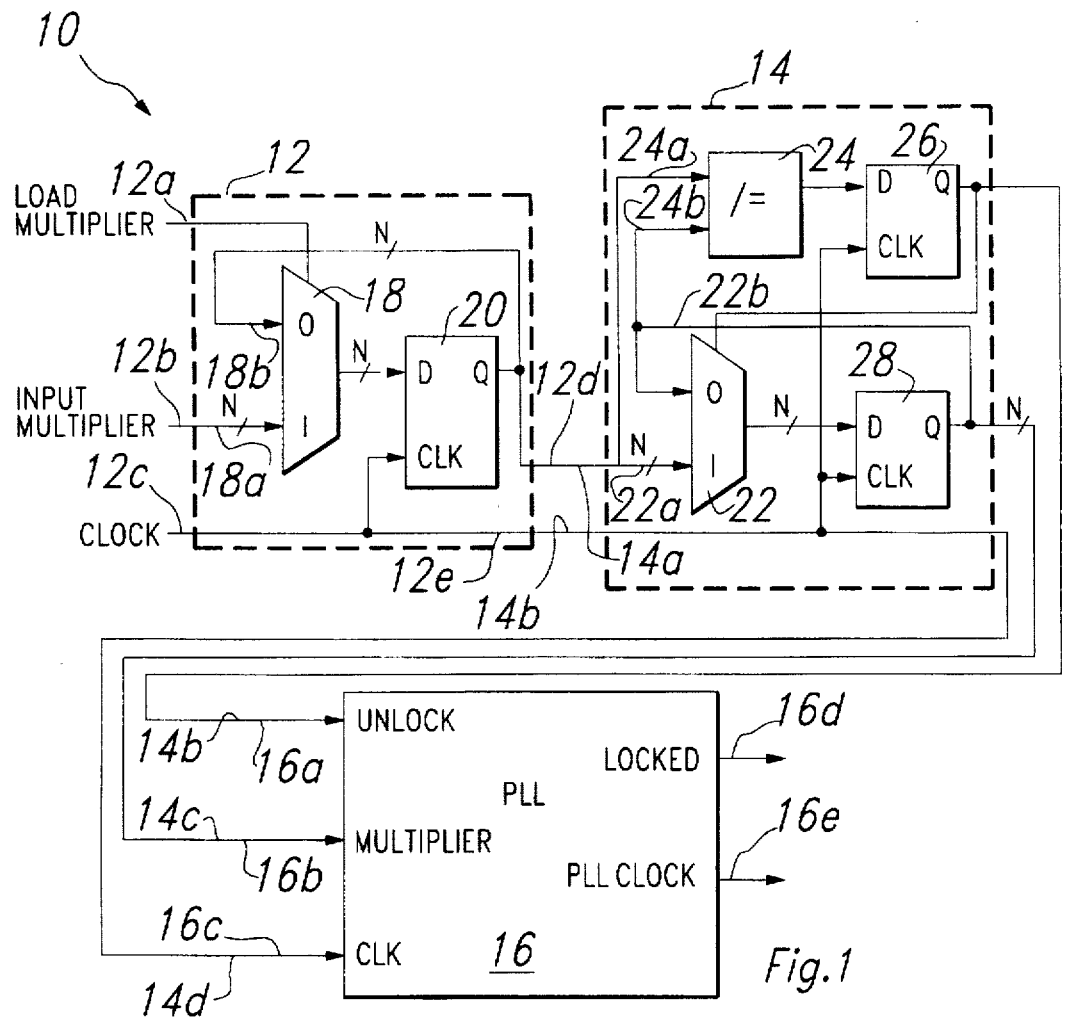
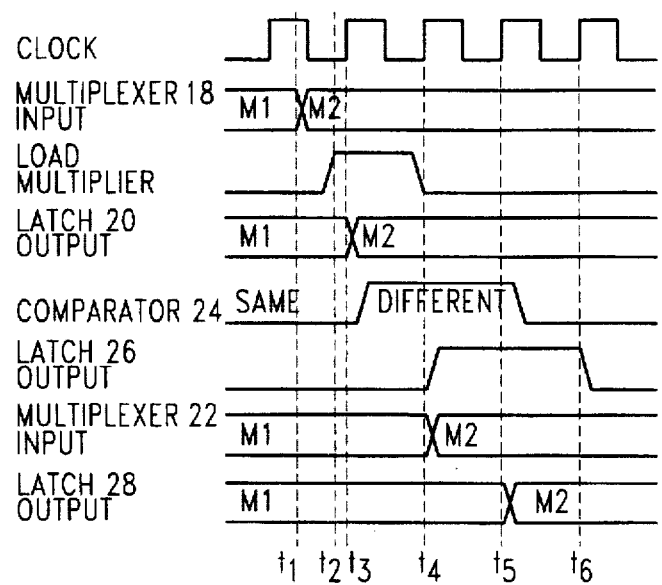
Fig.1
Fig.2

CONTROLLABLY SWITCHED PHASE LOCKED LOOP CIRCUITS, SYSTEMS, AND METHODS

This invention relates to phase locked loop technology, and is more particularly directed to controllably switched phase locked loop circuits, systems, and methods.

BACKGROUND OF THE INVENTION

The present invention addresses systems including a clock signal and, more particularly, where an attribute (e.g., the frequency) of that clock signal is changed during operation of the system. In these systems, typically a phase locked loop (PLL) is part of the implementation. Specifically, the PLL receives a clock signal and outputs a corresponding signal which tracks (or "locks" to) the input clock signal. In the example of changing clock frequency with a PLL, a frequency amplifier signal is applied to the PLL and the PLL in response outputs a clock signal with an increased frequency over the frequency of the received clock signal. Often in the art the frequency amplifier signal is referred to as a multiplier because it causes the PLL output clock signal to operate at a multiple of the PLL input clock signal. The multiplier is typically a signal which addresses a lookup table in the PLL and, in response to the lookup function, the PLL determines the amount of desired amplification to the frequency of the input clock signal. The amplification to the frequency may or may not be an integer multiple, but is usually a value greater than one.

Various modern systems use circuit implementations including adjusted frequency PLLs. For example, in many contemporary microprocessor systems, the clock signal frequency changes in order to accommodate power efficiency considerations. Thus, during periods when the microprocessor is in increased use, the system clock signal frequency is increased. In contrast, when use of the microprocessor decreases, the system clock signal frequency may be decreased to conserve power consumption. In all events, the transition of clock signal frequency must be handled in a manner to ensure that the many microprocessor components which operate in response to the clock signal do not produce erroneous results during the transition time as the system clock frequency is changed. Otherwise, the components of the system which operate in response to the clock signal may be negatively affected when the clock signal changes frequency.

In the prior art, one technique used to address the above is to reset the microprocessor before changing the system clock frequency. While this approach typically ensures that all components receiving the reset do not operate during that event, it also suffers various drawbacks. For example, this approach requires a significant cessation of system activity during the reset and, therefore, is inefficient, particularly in view of the ever-expanding need to minimize processor down time. As another example, this approach will not work in a system requiring clock signal adjustment at a period when reset is not possible. In addition to the microprocessor example given above, any clocked system could benefit by a system which can change a system clock attribute without having to reset the entire system during that event. Thus, there arises a need to address the drawbacks of the prior art and to provide improved controllably switched phase locked loop circuits, systems, and methods which do not require a system reset to perform a valid change between system clock attributes.

SUMMARY OF THE INVENTION

In one embodiment, there is disclosed a clock circuit system. The system includes a phase locked loop circuit having a clock signal input, a clock signal lock input, and a clock adjustment signal input. The system further includes circuitry for coupling a clock signal to the clock signal input, circuitry for coupling a first clock adjustment signal to the clock adjustment signal input, and circuitry for comparing the first clock adjustment signal to a second clock adjustment signal. Lastly, the system includes circuitry responsive to the comparing circuitry. This responsive circuitry includes firstly, circuitry for coupling a signal to the clock signal lock input such that the phase locked loop circuit indicates an unlocked state, and secondly circuitry for coupling the second clock adjustment signal to the clock adjustment signal input after the phase locked loop circuit indicates an unlocked state.

Other circuits, systems, and methods are also disclosed and claimed.

BRIEF DESCRIPTION OF THE DRAWINGS

FIG. 1 illustrates a schematic of one embodiment for switching a phase locked loop circuit from a first clock multiplier signal to a second clock multiplier signal;

FIG. 2 illustrates a timing diagram demonstrating the operation of the schematic of FIG. 1.

DETAILED DESCRIPTION OF THE PREFERRED EMBODIMENTS

Figure 3:
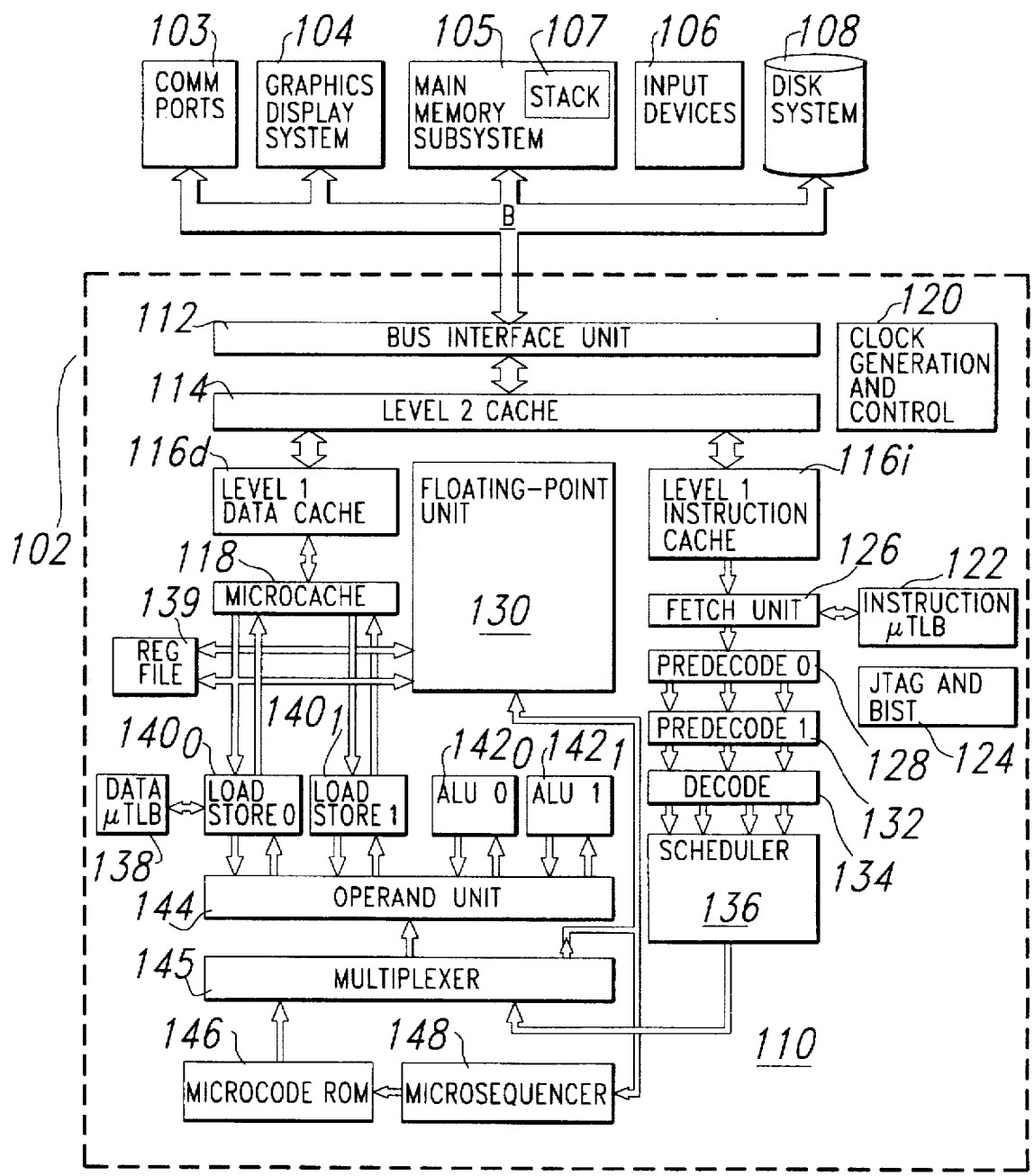
FIG. 3 illustrates a block diagram of a computer system and microprocessor embodiment into which the above embodiments may be incorporated.

FIG. 1 illustrates a schematic of a clock system embodiment designated generally at 10. For purposes of explanation and as better appreciated below, system 10 is divided into three overall components, those including a multiplier storage device 12, a multiplier update circuit 14, and a phase locked loop ("PLL") 16. Multiplier storage device 12 has three inputs, including a control input 12a, a multiplier signal input 12b, and a clock signal input 12c. Storage device 12 outputs a multiplier on output 12d to multiplier input 14a of update circuit 14. Further, the clock signal received by storage 12 passes via output 12e to clock input 14b of update circuit 14. Update circuit 14 outputs a lock control signal via output 14b to input 16a of PLL. In addition, update circuit 14 outputs a multiplier via output 14c to input 16b of PLL. Lastly, the clock signal received by update circuit 14 passes via output 14d to input 16c of PLL 16. PLL 16 has two outputs, including a first output 16d for providing a PLL locked signal and a second output 16e for providing a PLL modified clock signal.

Before discussing the preferred details of each of the three overall components of FIG. 1, the following is a general discussion of the operation of those components, with a detailed explanation given below in connection with FIG. 2. Multiplier storage device 12 receives and stores a signal representing a desired change to the frequency of the clock signal output by the system of FIG. 1 (i.e., the clock signal output by PLL 16). As discussed above, this signal is typically referred to as a multiplier, although the signal may be any representation of a change, either integer or non-integer, in the frequency or some other attribute of the clock signal. Multiplier storage device 12 outputs the stored multiplier to update circuit 14. In response, update circuit 14 compares the multiplier to any multiplier it previously received from storage circuit 12. If the newly-received multiplier matches the preceding multiplier, update circuit 14 takes no immediate action. On the other hand, if the newly-received multiplier is different than the preceding multiplier, update circuit 14 performs two operations. First, update circuit 14 causes PLL 16 to indicate that the clock signal output by PLL 16 may be unlocked and therefore should not be relied upon by other clock-reliant components as described in greater detail below. Second, and only after PLL 16 indicates that its output clock signal may be unlocked, update circuit 14 couples the newly-received multiplier to PLL 16. In response, PLL 16 is able to receive the new multiplier and modify its output clock signal accordingly. Thereafter, PLL 16 locks to its newly produced output and then indicates that it has locked so that other clock-reliant components may resume reliance on the clock output by PLL 16, thereby completing the overall operation of the components of FIG. 1. As demonstrated by the detailed discussion below, this overall operation properly ensures that components which operate from the clock signal provided by PLL 16 operate in a satisfactory manner and without requiring a system reset.

Returning now to storage circuit 12, that circuit includes a multiplexer 18 and a latch 20. Control input 12a is connected to control multiplexer 18. A first data input 18a of multiplexer 18 is connected to multiplier input 12b and, therefore, receives a new multiplier signal when it is presented at input 12b. A second data input 18b of multiplexer 18 is connected to the data output of latch 20. Note that both data inputs of multiplexer 18 receive a signal which is N bits wide. The size of N is merely an implementation detail, and depends on the necessary multiplier input to PLL 16. For example, if PLL 16 were operable to apply four different multipliers to its input clock signal, then N most likely equals 2 (i.e., $2^2=4$) so that any of the four different multipliers can be selected. The data output of multiplexer 18 is connected to the data input of latch 20 and, again, this data is N bits wide. Thus, while only a single latch 20 is shown, one skilled in the art will appreciate that N such latches are included, so that each individual latch can receive, store, and output one of the total of N bits. Again, therefore, in the example where N equals two, then a total of two latches are included as latch 20. Latch 20 is clocked by the clock signal attached to clock input 12c. Lastly, latch 20 outputs its data to input 14a of update circuit 14 and, as mentioned above, that data is also fed back to the first data input 18b of multiplexer 18.

Continuing now with the details of update circuit 14, that circuit includes a multiplexer 22, a comparator 24, a latch 26, and a latch 28. A first data input 22a of multiplexer 22 is connected to update circuit input 14a and, therefore, receives the multiplier which is output by storage device 12. A second data input 22b of multiplexer 22 is connected to the data output of latch 28. The control input of multiplexer 22 is connected to the data output of latch 26. Turning now to comparator 24, it also has two data inputs. A first data input 24a of comparator 24 is connected to update circuit input 14a and also, therefore, receives the multiplier which is output by storage device 12. A second data input 24b of comparator 24 is connected to the data output of latch 28. The output of comparator 24 is connected to the data input of latch 26. Latch 26 is clocked by the clock signal received at input 14b, and its data output is connected, via output 14b to the UNLOCK control input 16a of PLL 16. As stated above, the data output of latch 26 is further connected to the control input of multiplexer 22. As also mentioned above, the data input of latch 28 is connected to the data output of multiplexer 22. Latch 28 is clocked by the clock signal received at input 14b, and its data output is connected, via output 14c to input 16b, to couple a multiplier signal to PLL 16. As stated above, the data output of latch 28 is further connected to data input 24b of comparator 24. Note again that latch 28 is shown to receive N bits, with it therefore understood that latch 28 is actually duplicated N times, with each single latch receiving a corresponding one of the N bits. In contrast, latch 26 is preferably a single latch because, in the present embodiment, only a single signal is required to control multiplexer 22 and the UNLOCK input of PLL 16.

PLL 16 may be one of many types of known PLL circuits. In each instance, the selected PLL should include a clock input and a clock output. In addition, the preferred PLL used with the present embodiment includes an input for adjusting the clock signal where, in the preferred embodiment, this adjustment is a multiplier signal as discussed above. Still further, the preferred PLL includes a LOCKED output 16d. As known in the art, the value output by PLL 16 at its LOCKED output 16d is controlled by either of two events. First, the value output at LOCKED output 16d indicates an unlocked PLL 16 if, in fact, PLL 16 is actually unlocked. Typically, such an unlock occurs if there is a change in either the multiplier at input 16b or the clock signal at input 16c. Second, the value output at LOCKED output 16d indicates an unlocked state in response to an assertion of the signal at UNLOCK input 16a. Note that, in actuality, this latter instance does not unlock PLL 16; instead, it merely causes PLL 16 to assert the value at its LOCKED output 16d, thereby indicating to any component monitoring that output that PLL 16 may be unlocked. It is stated here that the output "may be" unlocked because, in actuality, in this instance PLL 16 may be locked but is receiving an assertion at its UNLOCK input 16a to indicate to the contrary via its LOCKED output 16d. The purpose of causing PLL 16 to indicate an unlocked status while it is in fact locked is because, despite the locked nature of PLL 16, the clock signal then being output by PLL 16 may not be reliable for reasons such as it may soon become unlocked in fact. The benefits of this additional indication of unlock is readily apparent given the operational description below. Note at this point, however, that either of the two events causing an unlocked indication operate to ensure proper system operation. Particularly, any clock-reliant component which is connected to the clock signal at output 16e of PLL 16 is, of course, preferably clocked by a reliable clock signal. Thus, when operating in conjunction with PLL 16, those clock-reliant circuits may further monitor LOCKED output 16d. When LOCKED output 16d indicates that PLL 16 is (or may be) unlocked, and regardless of whether or not PLL 16 is in fact then unlocked, such clock-reliant circuits are informed that clock signal then being output by PLL 16 may not be reliable, regardless of the reason. As such, during this period the clock-reliant circuits either cease operation, or preferably switch to be clocked by an alternative clock source. Note that a PLL with the above features is incorporated in a microprocessor product sold by Texas Instruments Incorporated, and which is commercially identified by part number TI-486SXL.

Having described in general the operation of clock system 10 as well as the details of its components, FIG. 2 illustrates a timing diagram of the specific operation of those components to accomplish the operations set forth above. Thus, before proceeding, recall generally that multiplier storage device 12 receives a multiplier, stores it, and couples it to update circuit 14. In response, update circuit 14 determines whether the multiplier it received from device 12 is different than the one it was earlier receiving and, if so, both controls the unlock input signal to PLL 16 and couples the new multiplier to PLL 16. Once the new multiplier is connected to PLL 16, PLL 16 again locks to its input clock signal and thereafter indicates to any clock-reliant circuits that they may rely on the clock signal then output by PLL 16. Turning then to FIG. 2, the Figure assumes that the circuit of FIG. 1 is initially operating at a time other than reset and, therefore, assumes that a first multiplier (denoted M1) signal was earlier received and acted upon by each of the components in FIG. 1. Consequently, the following discussion continues with the event in which a second multiplier (denoted M2) signal is received by storage device 14, proceeding with the example where the second multiplier differs from the first multiplier. Although not shown in FIG. 2, thereafter follows a discussion of the example where the second multiplier is the same as the first multiplier.

Turning now to FIG. 2, at a time prior to t1 the multiplier is M1. Consequently, multiplexer 18 outputs M1 to latch 20 and latch 20 therefore has stored that information. In addition, latch 20 feeds back M1 to input 18b of multiplexer 18. Since signal LOAD MULTIPLIER is not asserted, multiplexer 18 continues to select the data at its input 18b. FIG. 1 demonstrates this selection by depicting a "0" convention associated with input 18b, thereby indicating that a low (i.e., de-asserted) signal at the multiplexer control input will select the input labeled with the "0". Because input 18b is selected, multiplexer 18 is selecting the output of latch 20 which continues to feed back the value of M1. Thus, a person skilled in the art will appreciate that multiplexer 18 and latch 20 operate as a storage device in this fashion.

At t1, the multiplier coupled to multiplier input 12 changes from M1 to M2, again assuming M2 differs from M1. Thereafter, at t2, circuitry (not shown) alerts system 10 of the need to react to the new multiplier by asserting the LOAD MULTIPLER signal. Consequently, multiplexer 18 now selects the data at its input 18a. FIG. 1 demonstrates this selection by using a "1" convention associated with input 18a, thereby indicating that a high signal at the multiplexer control input will select the input labeled with the "1". Because input 18a is selected, multiplexer 18 now outputs M2 to latch 20. Thus, at the next successive rising clock signal, that is at t3, latch 20 latches M2 and its output changes accordingly as shown in FIG. 2. Note further that once LOAD MULTIPLIER is thereafter de-asserted, storage device 12 will therefore continue to store M2 as it did with M1 above; thus, only once LOAD MULTIPLIER is again asserted will the multiplier value stored in storage circuit 12 be changed.

Once the output of latch 20 changes to M2 at t3, this information is necessarily connected to input 24a of comparator 24. Recall that input 24b of comparator 24 is connected to the data output of latch 28. Due to the earlier-described steady-state at M1, therefore, input 24a of comparator 24 is now receiving the value of M1 while input 24b of comparator 24 is now receiving the value of M2. Since the current example assumes M2 is different than M1, then following the latency period of operation for comparator 24, its output will change state shortly after t3 as shown in FIG. 2. The change of the comparator output is connected to the data input of latch 26. Thus, at the next rising clock signal, that is at t4, the output of latch 26 changes due to its new input.

The change of data at the output of latch 26 performs two functions. One function is connecting this change to the UNLOCK input of PLL 16 which, therefore, causes PLL 16 to indicate its potential unlocked state at its LOCKED output 16d as detailed above. Another function is connecting this change to the control input of multiplexer 22; thus, connecting the high signal to this control input causes multiplexer 22 to select the data at its input 22a and, therefore, the value of M2 is connected via multiplexer 22 to the data input of latch 28.

At t5, latch 28 is again clocked and, therefore, latch 28 outputs the value of M2 currently being applied to its data input. As a result, M2 is connected to multiplier input 16b of PLL 16. Therefore, note that M2 is connected to PLL 16 only after PLL 16 has indicated via its LOCKED output 16d that it may be unlocked or, at a minimum, that its then-output clock signal may not be reliable. The value of M2 now output by latch 28 is also connected to input 24b of comparator 24 and input 22b of multiplexer 22. With respect to comparator 24, therefore, note that after a brief time following t5, the output of comparator 24 changes to indicate that the same multiplier value is now applied to both of its inputs.

At t6, latch 26 changes its output due to the recognition by comparator 24 that both inputs to comparator 24 are alike. Again, this change of data at the output of latch 26 performs two functions, but in a manner to have a control effect opposite to that described above. Each of the two functions is described below.

The first function of the output of latch 26 at t6 is to release the signal to UNLOCK input 16a, thereby permitting PLL 16 to change its output at LOCKED output 16d if appropriate. In other words, one skilled in the art will appreciate that once the earlier signal to UNLOCK input 16a is released, the value at LOCKED output 16d thereafter reflects whether or not PLL 16 is, in fact, locked. For example, if PLL 16 has not yet re-locked after receiving the new multiplier M2, then even upon the t6 release at its UNLOCK input 16a, PLL 16 continues to indicate that it is unlocked at its LOCKED output 16d until PLL 16 actually locks to the new multiplier some short time later. Once PLL 16 then actually locks, it changes its LOCKED output 16d to indicate this event. On the other hand, if PLL 16 has already re-locked after receiving the new multiplier M2, then the t6 releasing of the UNLOCK input 16a causes LOCKED output 16d to change to indicate a locked status. In either example, therefore, PLL 16 first indicated an unlocked status at its LOCKED output 16d when it received the new multiplier, M2, and second was allowed to receive M2 and re-lock before it again indicated a locked status at its LOCKED output 16d.

The second function of latch 26 at t6 is connecting its changed output to the control input of multiplexer 22. Thus, connecting the low signal to this control input causes multiplexer 22 to select the data at its input 22b and, therefore, the value of M2 as stored by latch 28 is retained in a feedback manner until a new multiplier is later received (if such an event occurs).

From the above discussion, one skilled in the art will further appreciate that a new multiplier signal which is the same as the immediately preceding multiplier signal will have no change on the locked status of PLL 16 or its output clock signal. Particularly, assuming M2 were the same as M1 in the above example, then the output state of comparator 24 would not change and neither would the output of latch 26. As a result, multiplexer 22 would continue to select the value of M1 at its input 22b in the feedback manner described above. In other words, update circuit 14 necessarily maintains its storage and feedback state until a multiplier which is different than that stored by latch 28 is received by the circuit.

The above discussions demonstrate the operation as well as various benefits of the disclosed embodiments. For example, system 10 operates to maintain a steady state operation of PLL 16 until a new and different multiplier is received. As another example, if a different multiplier is received, system 10 ensures that PLL 16 is properly controlled to indicate that PLL 16 is (or may be) unlocked prior to receiving the new multiplier, and such indication is maintained until PLL 16 later locks after that new multiplier is so applied. Note also that system 10 minimizes the interim period to just a few clocks in which PLL 16 is unlocked due to the change in multipliers, which is far more desirable than the much larger time period which is likely to be exhausted by the prior art reset scheme set forth above. In addition, during the short few-cycle interim posed by the present embodiment, the remaining system circuits preferably switch to operate off of some standard bus clock or the like, again minimizing the effects of the transition between the older and newer multiplier signals. Indeed, the value of the LOCKED signal output 16d from PLL 16 could be used to trigger this temporary reliance on an alternative clock source. In such an embodiment, when LOCKED is de-asserted the other clock-reliant circuits switch to an alternative clock source and when LOCKED is thereafter re-asserted, those components can switch to the PLL output clock as a newly adjusted clock source.

Having described the above embodiments, a person skilled in the art will appreciate that such embodiments may be implemented in any system in which multiplied clock signals, or other signals adjusted through a PLL, are used. One key example of such a system is shown in FIG. 3 which illustrates a block diagram of a microprocessor embodiment into which the above embodiments may be incorporated. Referring now to FIG. 3, an exemplary data processing system 102, including an exemplary superscalar pipelined microprocessor 110 within which the preferred embodiment of the invention is implemented, will be described. It is to be understood that the architecture of system 102 and of microprocessor 110 is described herein by way of example only, as it is contemplated that the present invention may be utilized in microprocessors of various architectures. It is therefore contemplated that one of ordinary skill in the art, having reference to this specification, will be readily able to implement the present invention in such other microprocessor architectures.

Microprocessor 110, as shown in FIG. 3, is connected to other system devices by way of bus B. While bus B, in this example, is shown as a single bus, it is of course contemplated that bus B may represent multiple buses having different speeds and protocols, as is known in conventional computers utilizing the PCI local bus architecture; single bus B is illustrated here merely by way of example and for its simplicity. System 102 contains such conventional subsystems as communication ports 103 (including modem ports and modems, network interfaces, and the like), graphics display system 104 (including video memory, video processors, a graphics monitor), main memory system 105 which is typically implemented by way of dynamic random access memory (DRAM), input devices 106 (including keyboard, a pointing device, and the interface circuitry therefor), and disk system 108 (which may include hard disk drives, floppy disk drives, and CD-ROM drives). It is therefore contemplated that system 102 of FIG. 3 corresponds to a conventional desktop computer or workstation, as are now common in the art. Of course, other system implementations of microprocessor 110 can also benefit from the present invention, as will be recognized by those of ordinary skill in the art.

Microprocessor 110 includes bus interface unit 112 that is connected to bus B, and which controls and effects communication between microprocessor 110 and the other elements in system 102. BIU 112 includes the appropriate control and clock circuitry to perform this function, including write buffers for increasing the speed of operation, and including timing circuitry so as to synchronize the results of internal microprocessor operation with bus B timing constraints. Microprocessor 110 also includes clock generation and control circuitry 120 which, in this exemplary microprocessor 110, generates internal clock phases based upon the bus clock from bus B; the frequency of the internal clock phases, in this example, may be selectably programmed as a multiple of the frequency of the bus clock.

As is evident in FIG. 3, microprocessor 110 has three levels of internal cache memory, with the highest of these as level 2 cache 114, which is connected to BIU 112. In this example, level 2 cache 114 is a unified cache, and is configured to receive all cacheable data and cacheable instructions from bus B via BIU 112, such that much of the bus traffic presented by microprocessor 110 is accomplished via level 2 cache 114. Of course, microprocessor 110 may also effect bus traffic around cache 114, by treating certain bus reads and writes as "not cacheable". Level 2 cache 114, as shown in FIG. 3, is connected to two level 1 caches 116; level 1 data cache $116_d$ is dedicated to data, while level 1 instruction cache $116_i$ is dedicated to instructions. Power consumption by microprocessor 110 is minimized by only accessing level 2 cache 114 only in the event of cache misses of the appropriate one of the level 1 caches 116. Furthermore, on the data side, microcache 118 is provided as a level 0 cache, and in this example is a fully dual-ported cache.

As shown in FIG. 3 and as noted hereinabove, microprocessor 110 is of the superscalar type. In this example multiple execution units are provided within microprocessor 110, allowing up to four instructions to be simultaneously executed in parallel for a single instruction pointer entry. These execution units include two ALUs $142_0$, $142_1$ for processing conditional branch, integer, and logical operations, floating-point unit (FPU) 130, two load-store units $140_0$, $140_1$, and microsequencer 148. The two load-store units 140 utilize the two ports to microcache 118, for true parallel access thereto, and also perform load and store operations to registers in register file 139. Data microtranslation lookaside buffer (µTLB) 138 is provided to translate logical data addresses into physical addresses, in the conventional manner.

These multiple execution units are controlled by way of multiple seven-stage pipeline. These stages are as follows:

| | |
|---|---|
| F | Fetch: This stage generates the instruction address and reads the instruction from the instruction cache or memory |
| PD0 | Predecode stage 0: This stage determines the length and starting position of up to three fetched x86-type instructions |
| PD1 | Predecode stage 1: This stage extracts the x86 instruction bytes and recodes them into fixed length format for decode |
| DC | Decode: This stage translates the x86 instructions into atomic operations (AOps) |
| SC | Schedule: This stage assigns up to four AOps to the appropriate execution units |
| OP | Operand: This stage retrieves the register operands indicated by the AOps |
| EX | Execute: This stage runs the execution units according to the AOps and the retrieved operands |
| WB | Write back: This stage stores the results of the execution in registers or in memory |

Referring back to FIG. 3, the pipeline stages noted above are performed by various functional blocks within microprocessor 110. Fetch unit 126 generates instruction addresses from the instruction pointer, by way of instruction micro-translation lookaside buffer (µTLB) 122, which translates the logical instruction address to a physical address in the conventional way, for application to level 1 instruction cache 116$_i$. Instruction cache 116$_i$ produces a stream of instruction data to fetch unit 126, which in turn provides the instruction code to the predecode stages in the desired sequence. Speculative execution is primarily controlled by fetch unit 126, in a manner to be described in further detail hereinbelow.

Predecoding of the instructions is broken into two parts in microprocessor 110, namely predecode 0 stage 128 and predecode 1 stage 132. These two stages operate as separate pipeline stages, and together operate to locate up to three x86 instructions and apply the same to decoder 134. As such, the predecode stage of the pipeline in microprocessor 110 is three instructions wide. Predecode 0 unit 128, as noted above, determines the size and position of as many as three x86 instructions (which, of course, are variable length), and as such consists of three instruction recognizers; predecode 1 unit 132 recodes the multi-byte instructions into a fixed-length format, to facilitate decoding.

Decode unit 134, in this example, contains four instruction decoders, each capable of receiving a fixed length x86 instruction from predecode 1 unit 132 and producing from one to three atomic operations (AOps); AOps are substantially equivalent to RISC instructions. Three of the four decoders operate in parallel, placing up to nine AOps into the decode queue at the output of decode unit 134 to await scheduling; the fourth decoder is reserved for special cases. Scheduler 136 reads up to four AOps from the decode queue at the output of decode unit 134, and assigns these AOps to the appropriate execution units. In addition, the operand unit 144 receives and prepares the operands for execution. As indicated in FIG. 3, operand unit 144 receives an input from sequencer 144 and also from microcode ROM 146, via multiplexer 145, and fetches register operands for use in the execution of the instructions. In addition, according to this example, operand unit performs operand forwarding to send results to registers that are ready to be stored, and also performs address generation for AOps of the load and store type.

Microsequencer 148, in combination with microcode ROM 146, control ALUs 142 and load/store units 140 in the execution of microcode entry AOps, which are generally the last AOps to execute in a cycle. In this example, microsequencer 148 sequences through microinstructions stored in microcode ROM 146 to effect this control for those microcoded microinstructions. Examples of microcoded microinstructions include, for microprocessor 110, complex or rarely-used x86 instructions, x86 instructions that modify segment or control registers, handling of exceptions and interrupts, and multi-cycle instructions (such as REP instructions, and instructions that PUSH and POP all registers).

Microprocessor 110 also includes circuitry 124 for controlling the operation of JTAG scan testing, and of certain built-in self-test functions, ensuring the validity of the operation of microprocessor 110 upon completion of manufacturing, and upon resets and other events.

Given the description of FIG. 3, as well as the descriptions above such as those relating to the prior Figures, one skilled in the art may appreciate that the above embodiments may be incorporated into clock generation and control circuitry 120. Various related functionality may be further performed by the appropriate circuitry within FIG. 3.

From the above, it may be appreciated that the embodiments described herein provide various benefits over the prior art. Further, while the embodiments have been described in detail, various substitutions, modifications or alterations could be made to the descriptions set forth above. For example, the preferred embodiment relates to a PLL multiplier signal, but other clock adjustment signals could be treated with the embodiments above in an effective manner. As another example, microprocessors other than that described above likewise may benefit from these embodiments, either alone or in combination with additional clock varying circuits. Thus, these examples as well as others determed by a person skilled in the art demonstrate the inventive scope, and further demonstrate that the examples are not all limiting and can be expanded upon without departing from the inventive scope which is defined by the following claims.

What is claimed is:

1. A clock circuit system, comprising:
   a phase locked loop circuit having a clock signal input, a clock signal lock input, and a clock adjustment signal input;
   circuitry for coupling a clock signal to the clock signal input;
   circuitry for coupling a first clock adjustment signal to the clock adjustment signal input;
   circuitry for comparing the first clock adjustment signal to a second clock adjustment signal; and
   circuitry responsive to said comparing circuitry, said circuitry comprising:
      circuitry for coupling a signal to the clock signal lock input such that the phase locked loop circuit indicates an unlocked state; and
      circuitry for coupling the second clock adjustment signal to the clock adjustment signal input after the phase locked loop circuit indicates an unlocked state.

2. The clock circuit system of claim 1 and further comprising circuitry for releasing the signal to the clock signal lock input such that the phase locked loop circuit is allowed to indicate a locked state after the second clock adjustment signal is coupled to the clock adjustment signal input.

3. The clock circuit system of claim 1 wherein the clock adjustment signal input comprises a clock multiplier signal input, and wherein:
   said circuitry for coupling a first clock adjustment signal to the clock adjustment signal input comprises circuitry for coupling a first clock multiplier signal to the clock multiplier signal input; and
   said circuitry for coupling a second clock adjustment signal to the clock adjustment signal input comprises circuitry for coupling a second clock multiplier signal to the clock multiplier signal input.

4. The clock circuit system of claim 1 and further comprising circuitry for storing the second multiplier.

5. A microprocessor-based computer system, comprising:
   an input device;
   a display system;
   a main memory; and
   a microprocessor, coupled to the input device, display system and main memory, and comprising:
      a phase locked loop circuit having a clock signal input, a clock signal lock input, and a clock adjustment signal input;
      circuitry for coupling a clock signal to the clock signal input;
      circuitry for coupling a first clock adjustment signal to the clock adjustment signal input;

circuitry for comparing the first clock adjustment signal to a second clock adjustment signal; and circuitry responsive to said comparing circuitry, said circuitry comprising:

circuitry for coupling a signal to the clock signal lock input such that the phase locked loop circuit indicates an unlocked state; and circuitry for coupling the second clock adjustment signal to the clock adjustment signal input after the phase locked loop circuit indicates an unlocked state.

6. The microprocessor-based computer system of claim 5 and further comprising circuitry for coupling a signal to the clock signal lock input such that the phase locked loop circuit is placed in a locked state after the second clock adjustment signal is coupled to the clock adjustment signal input.

7. The microprocessor-based computer system of claim 5 wherein the clock adjustment signal input comprises a clock multiplier signal input, and wherein:

said circuitry for coupling a first clock adjustment signal to the clock adjustment signal input comprises circuitry for coupling a first clock multiplier signal to the clock multiplier signal input; and said circuitry for coupling a second clock adjustment signal to the clock adjustment signal input comprises circuitry for coupling a second clock multiplier signal to the clock multiplier signal input.

8. The microprocessor-based computer system of claim 5 and further comprising circuitry for storing the second multiplier.

9. A method of operating a phase locked loop circuit having a clock signal input, a clock signal lock input, and a clock adjustment signal input:

the method first comprising the steps of:
coupling a clock signal to the clock signal input;
coupling a first clock adjustment signal to the clock adjustment signal input; and the method second comprising the steps of:
first, coupling a signal to the clock signal lock input such that the phase locked loop circuit indicates an unlocked state; and
second, coupling the second clock adjustment signal to the clock adjustment signal input.

10. The method of claim 9 and the method third comprising the step of releasing the signal to the clock signal lock input such that the phase locked loop circuit is allowed to indicate a locked state.

11. The method of claim 9 wherein the clock adjustment signal input comprises a clock multiplier signal input, and wherein:

said step of coupling a first clock adjustment signal to the clock adjustment signal input comprises coupling a first multiplier to the clock multiplier signal input; and said step of coupling a second clock adjustment signal to the clock adjustment signal input comprises coupling a second multiplier to the clock multiplier signal input, wherein the second multiplier signal differs from the first multiplier signal.

12. The method of claim 9 and further comprising, prior to said step of second, coupling a second clock adjustment signal to the clock adjustment signal input, the step of storing the second multiplier.

13. The method of claim 9 and further comprising, prior to said step of second, coupling a second clock adjustment signal to the clock adjustment signal input, the steps of:

receiving the second clock adjustment signal; and
comparing the second clock adjustment signal to the first clock adjustment signal.

14. The method of claim 13 wherein said step of first, coupling a signal to the clock signal lock input such that the phase locked loop circuit indicates an unlocked state occurs in response to said comparing step determining that the second clock adjustment signal represents a different adjustment than the first clock adjustment signal.

15. The method of claim 9 wherein the phase locked loop circuit has an output clock signal, and further comprising the steps of:

first, prior to the phase locked loop circuit indicating an unlocked state, clocking a clock-reliant circuit in response to the output clock signal;

second, detecting that the phase locked loop circuit is placed in an unlocked state; and third, clocking the clock-reliant circuit in response to a clock signal other than the output clock signal.

16. A method of operating a phase locked loop circuit having a clock signal input, a clock signal lock input, and a clock signal multiplier input:

the method first comprising the steps of:
coupling a clock signal to the clock signal input;
coupling a first clock signal multiplier to the clock signal multiplier input; and the method second comprising the steps of:
first, coupling a signal to the clock signal lock input such that the phase locked loop circuit indicates an unlocked state; and
second, coupling a second clock signal multiplier to the clock signal multiplier input;

the method third comprising the step of releasing the signal to the clock signal lock input such that the phase locked loop circuit is allowed to indicate a locked state.

17. The method of claim 16 and further comprising prior to said step of second, coupling a second clock signal multiplier to the clock signal multiplier input, the steps of:

receiving the second clock signal multiplier; and
comparing the second clock signal multiplier to the first clock signal multiplier.

18. The method of claim 17 wherein said step of first, coupling a signal to the clock signal lock input such that the phase locked loop circuit indicates an unlocked state occurs in response to said comparing step determining that the second clock multiplier signal represents a different multiplier than the first clock multiplier signal.

* * * * *